(12) United States Patent
Kyung et al.

(10) Patent No.: US 11,342,020 B2
(45) Date of Patent: May 24, 2022

(54) VARIABLE RESISTIVE MEMORY DEVICE AND METHOD OF OPERATING THE SAME

(71) Applicant: SK hynix Inc., Icheon-si (KR)

(72) Inventors: Ki Myung Kyung, Icheon-si (KR); Jung Hyuk Yoon, Icheon-si (KR); Ki Won Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 129 days.

(21) Appl. No.: 16/933,636

(22) Filed: Jul. 20, 2020

(65) Prior Publication Data

US 2021/0264979 A1   Aug. 26, 2021

(30) Foreign Application Priority Data

Feb. 25, 2020  (KR) .................. 10-2020-0022771

(51) Int. Cl.
*G11C 7/00* (2006.01)
*G11C 13/00* (2006.01)

(52) U.S. Cl.
CPC ........ *G11C 13/0069* (2013.01); *G11C 13/003* (2013.01); *G11C 13/0004* (2013.01); *G11C 13/0026* (2013.01); *G11C 13/0028* (2013.01); *G11C 2013/0078* (2013.01); *G11C 2213/79* (2013.01)

(58) Field of Classification Search
CPC ............ G11C 13/0069; G11C 13/0004; G11C 13/0026; G11C 13/0028
USPC .................................................... 365/189.16
See application file for complete search history.

(56) References Cited

U.S. PATENT DOCUMENTS

| | | | |
|---|---|---|---|
| 9,779,811 B2 | 10/2017 | Castro | |
| 9,911,473 B1 * | 3/2018 | Singh | ........................ G11C 7/18 |
| 10,020,052 B2 | 7/2018 | Kwon | |
| 10,853,169 B2 * | 12/2020 | Jeong | ...................... G06F 3/064 |
| 2010/0072451 A1 * | 3/2010 | Terao | ...................... H01L 45/06 |
| | | | 257/4 |
| 2017/0358353 A1 | 12/2017 | Castro | |

* cited by examiner

*Primary Examiner* — Vu A Le
(74) *Attorney, Agent, or Firm* — William Park & Associates Ltd.

(57) ABSTRACT

A variable resistive memory device includes a memory cell array and a control circuit block. The memory cell array includes a plurality of memory cells that are connected between a global word line and a global bit line. The control circuit block is positioned on at least one of edge portions of the memory cell array. The memory cell array is classified into a first group with the memory cells that are adjacent to the control circuit block and a second group with the memory cells that are remote in relation to the control circuit block. The second group is farther from the control circuit block than the first group. The control circuit block includes a write control unit that generates a control signal for writing on the memory cell in the first group in a different way compared to writing on the memory cell in the second group.

20 Claims, 11 Drawing Sheets

FIG.11
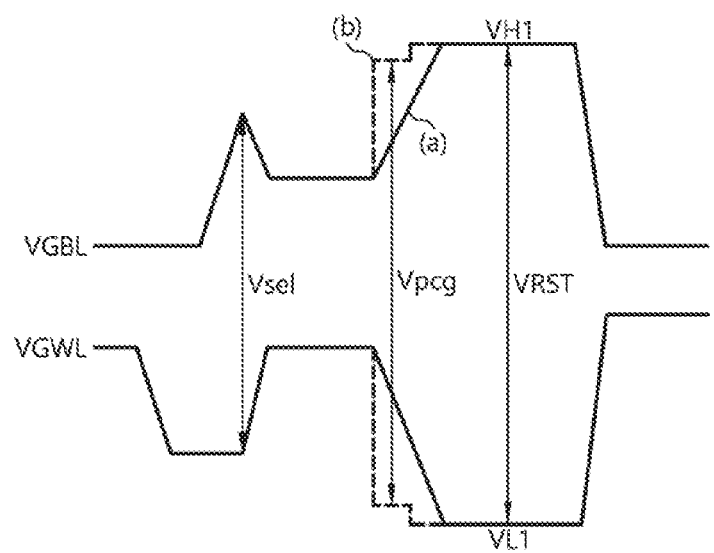
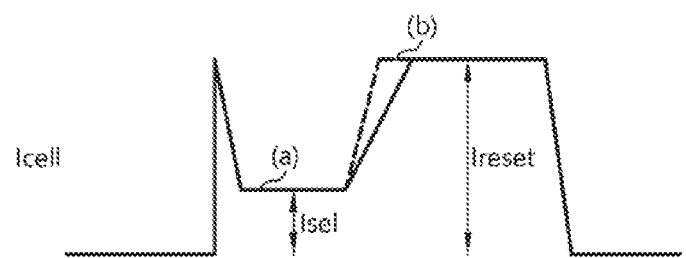

VARIABLE RESISTIVE MEMORY DEVICE AND METHOD OF OPERATING THE SAME

CROSS-REFERENCES TO RELATED APPLICATION

The present application claims priority under 35 U.S.C. § 119(a) to Korean application number 10-2020-0022771, filed on Feb. 25, 2020, in the Korean Intellectual Property Office, which is incorporated herein by reference in its entirety.

BACKGROUND

1. Technical Field

Various embodiments may generally relate to a variable resistive memory device and a method of operating the same, more particularly, a phase change memory device and a method of writing the phase change memory device.

2. Related Art

Recently, next-gen memory devices, replacing a DRAM device and a flash memory device, are being widely developed. The next-gen memory devices may include a variable resistive memory device by using a material that may include a resistance that rapidly changes based on an applied bias to switch at least two resistance states, i.e., a variable resistive material. The variable resistive memory device may include a phase change random access memory (PCRM), a resistive random access memory (RRAM), a magnetic random access memory (MRAM), a ferroelectric random access memory (FRAM), etc.

The variable resistive memory device may include a memory cell array with a cross point array structure and a control circuit block. The memory cell array may include a plurality of word lines, a plurality of bit lines that intersect with the word lines, and memory cells that are formed at intersection points of the word lines and the bit lines.

The memory cells may include a variable resistance. The variable resistance may be changed based on a voltage difference between the word line and the bit line.

The word line and the bit line with a uniform width and a uniform length may be extended to generate an RC delay. Thus, memory characteristics of the memory cell may be different from each other based on distances between the memory cell and the control circuit block for providing a voltage.

SUMMARY

In example embodiments of the present disclosure, a variable resistive memory device may include a memory cell array and a control circuit block. The memory cell array may include a plurality of memory cells that are connected between a global word line and a global bit line. The control circuit block may be positioned on at least one of edge portions of the memory cell array. The memory cell array may be classified into a first group with the memory cells that are adjacent to the control circuit block and a second group with the memory cells remote in relation to the control circuit block. The second group is farther from the control circuit block than the first group. The control circuit block may include a write control unit that is configured to generate a control signal for writing on the memory cell in the first group in a different way compared to writing on the memory cell in the second group.

In example embodiments of the present disclosure, a variable resistive memory device may include a memory cell array and a control circuit block. The memory cell array may include a plurality of memory cells that are connected between a global word line and a global bit line. The control circuit block may be configured to control operations of the memory cells. The control circuit block may include a write circuit and a detection circuit. The write circuit may be configured to apply a pre-selection current to the memory cell and to apply a write current to the memory cell after turning-on the memory cell based on a position of a selected memory cell. The write circuit may be configured to apply a pre-charge current, which may be different from the pre-selection current, to the memory cell and to apply the write current to the memory cell after turning-on the memory cell based on the position of the selected memory cell. The detection circuit may be connected to the global word line to detect a current of the selected memory cell. The detection circuit may be configured to enable a detection signal when turning-on the selected memory cell.

In example embodiments of the present disclosure, based on a method of operating a variable resistive memory device, a position of a selected memory cell may be identified when a write operation is initiated. A pre-selection voltage and a pre-selection current may be provided to the selected memory cell when the selected memory cell is positioned in a first group. A write voltage and a write current may be provided to the selected memory cell after stopping the supplying of the pre-selection voltage and the pre-selection current when the selected memory cell is turned-on or a snapback may be generated in the selected memory cell. A pre-selection voltage and a pre-selection current may be provided to the selected memory cell when the selected memory cell is positioned in a second group. The write voltage and the write current may be provided to the selected memory cell after stopping the supplying of the pre-selection voltage and the pre-selection current when the selected memory cell is turned-on or the snapback may be generated in the selected memory cell. The pre-selection voltage may be different from the pre-charge voltage.

BRIEF DESCRIPTION OF THE DRAWINGS

The above and another aspects, features and advantages of the subject matter of the present disclosure will be more clearly understood from the following detailed description taken in conjunction with the accompanying drawings, in which:

FIG. 11 is a view diagram, illustrating a pre-selection operation and a pre-charge operation, in accordance with example embodiments.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
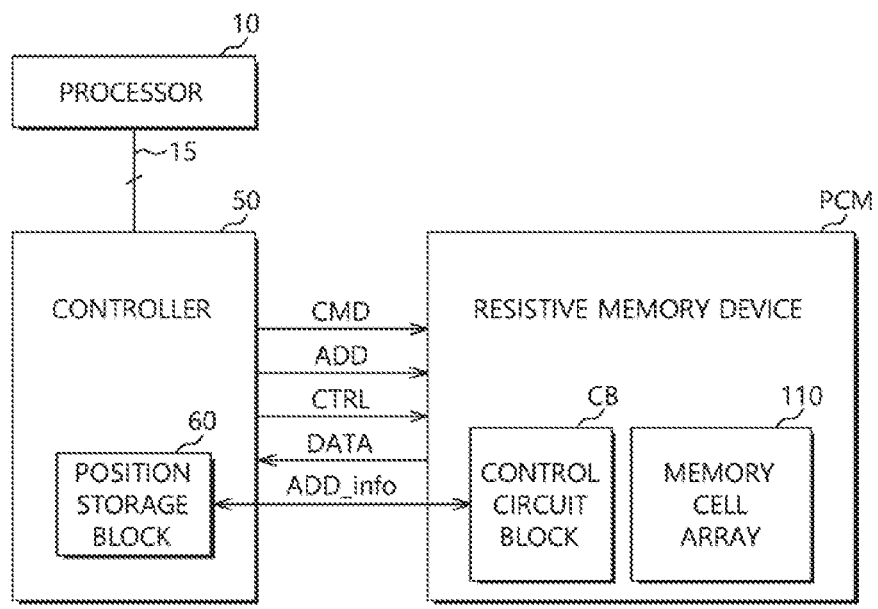
FIG. 1 is a block diagram, illustrating a variable resistive memory system, in accordance with example embodiments.

FIG. 1 is a block diagram, illustrating a variable resistive memory system, in accordance with example embodiments.

Referring to FIG. 1, a semiconductor memory system 100 may include a processor 10, a controller 50 and a variable resistive memory device PCM.

The processor 10 may be electrically connected with the controller 50 via a plurality of buses 15. The processor 10 may provide the controller 50 with memory access requests with a memory address and data, such as a read request, a write request, etc.

The controller 50 may provide the variable resistive memory device PCM with a command CMD, an address ADD, data DATA, and a control signal CTRL to operate the memory device. The controller 50 may include a position storage block 60. The position storage block 60 may be configured to store position information of memory cells in a memory cell array 110 of the variable resistive memory device PCM. For example, the position storage block 60 may differentiate whether the memory cell corresponds to an adjacent cell group or a remote cell group based on the addresses of the memory cells. The position storage block 60 may include a register. The variable resistive memory device PCM may include the memory cell array 110 and the control circuit block CB.

In example embodiments, the position storage block 60 may be positioned in the controller 50. Alternatively, the position storage block 60 may be positioned in the control circuit block CB of the variable resistive memory device PCM.

Figure 2:
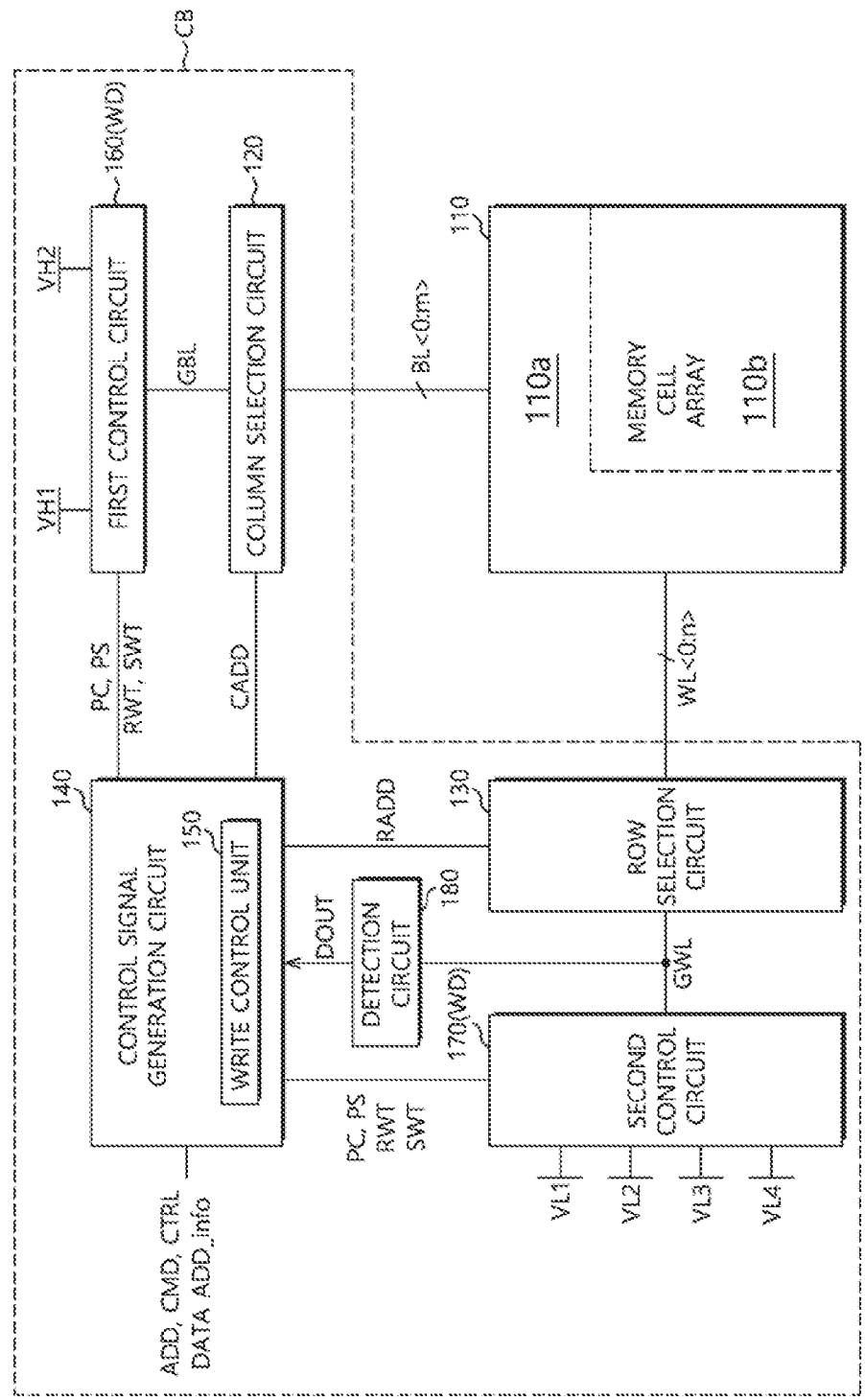
FIG. 2 is a block diagram, illustrating a variable resistive memory device, in accordance with example embodiments.
Figure 3:
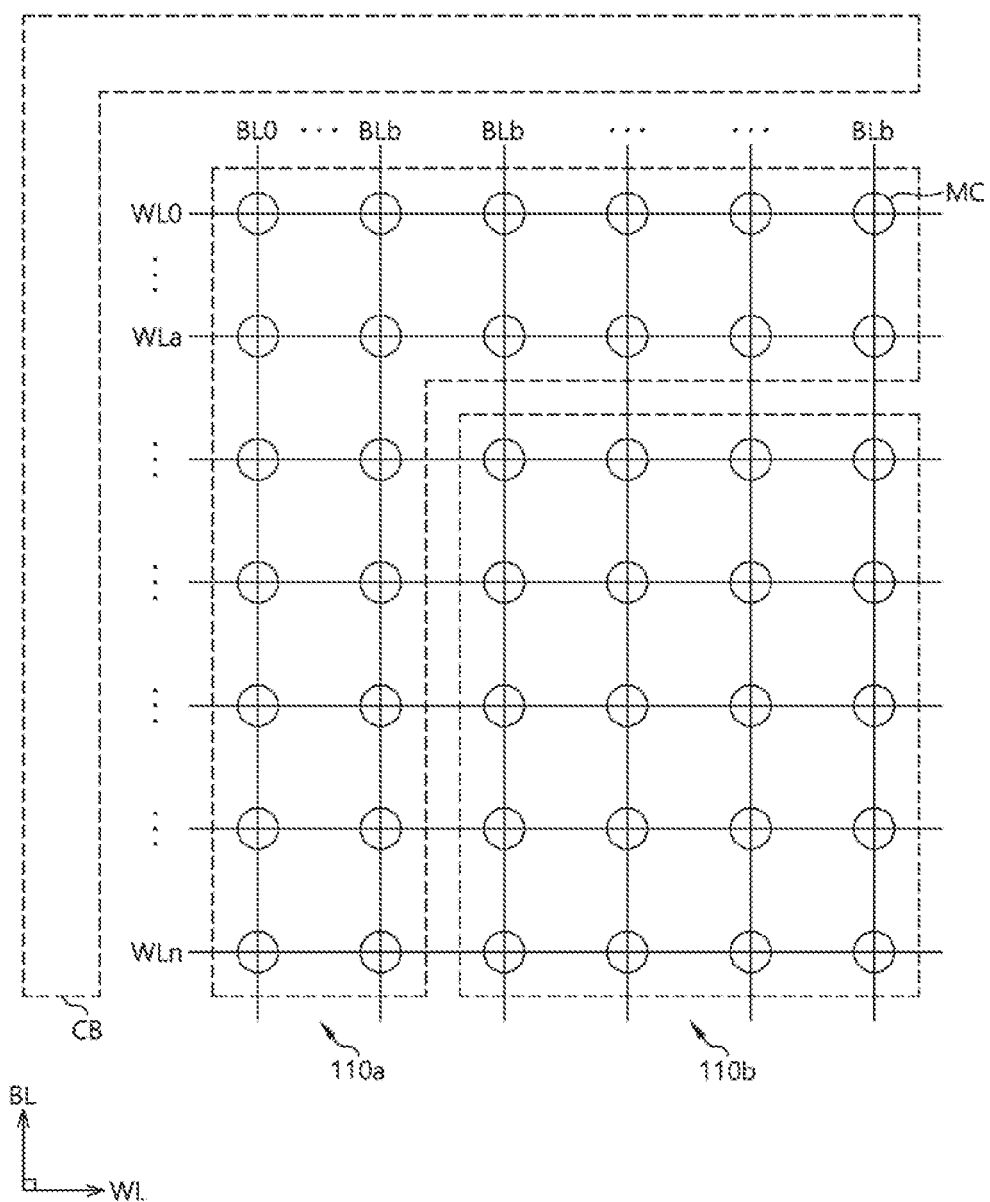
FIG. 3 is a view, illustrating a memory cell array of a variable resistive memory device, in accordance with example embodiments.
Figure 4:
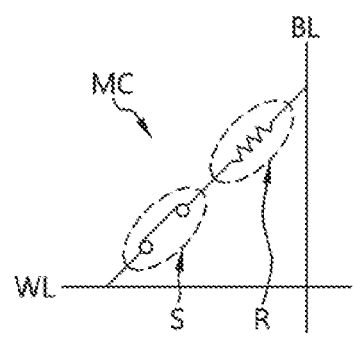
FIG. 4 is a circuit diagram, illustrating a memory cell structure, in accordance with example embodiments.

FIG. 2 is a block diagram, illustrating a variable resistive memory device, in accordance with example embodiments. FIG. 3 is a view, illustrating a memory cell array of a variable resistive memory device, in accordance with example embodiments. Furthermore, FIG. 4 is a circuit diagram, illustrating a memory cell structure, in accordance with example embodiments.

Referring to FIG. 2, the variable resistive memory device PCM may include the memory cell array 110 and the control circuit block CB. The control circuit block CB may include control circuits that are configured to control operations of the memory cell array 110.

Referring to FIG. 3, the memory cell array 110 may include a plurality of word lines WL0~WLn and a plurality of bit lines BL0~BLm. The word lines WL0~WLn and the bit lines BL0~BLm may intersect each other. A plurality of memory cells MC may be arranged at intersection points of the word lines WL0~WLn and the bit lines BL0~BLm. The memory cell array 110 of example embodiments may have a cross point array type where the memory cells MC may be located at the intersection points of the word lines WL0~WLn and the bit lines BL0~BLm. Further, the memory cell array 110 may have a three-dimensional stack structure.

The memory cells MC of the memory cell array 110 may be classified into a first group 110a and a second group 110b based on distances between the memory cells MC and the control circuit block CB. For example, the first group 110a may include the memory cells MC that are adjacent to the control circuit block CB. The second group 110b may include the memory cells MC that are remote in relation to the control circuit block CB. The memory cells MC in the first group 110a and the memory cells MC in the second group 110b may be controlled in different ways. The classification of the first group 110a and the second group 110b may be set and changed by a designer based on previous data.

Classification criteria of the first and second groups 110a and 110b may be stored in the position storage block 60 of the controller 50. For example, the position storage block 60 may include a mode register set (MRS). The position storage block 60 may receive an access request or access address to determine whether an accessed memory cell may correspond to the first group 110a or the second group 110b. The position storage block 60 may provide the control circuit block 60 of the variable resistive memory device PCB with determined results as position address information ADD_info.

Referring to FIG. 4, the memory cell MC may include a selection element S and a variable resistance R that are connected between the word line WL and the bit line BL.

The selection element S may include a diode or a MOS transistor. The selection element S may include a switch with a phase change material. The selection element S may include an Ovonic threshold switch (OTS) with a phase change layer.

The variable resistance R may include a memory layer. The variable resistance R may represent different resistance values based on a voltage difference between the bit line BL and the word line WL, The variable resistance R may include the phase change layer or a resistance change layer. The phase change layer may include GaSb, InSb, InSe, $Sb2Te_3$, GeTe, GeSbTe, GaSeTe, InSbTe, $SnSb_2Te_4$, InSbGe, AgInSbTe, (GeSn)SbTe, GeSb(SeTe), $Te_{81}Ge_{15}Sb_2S_2$, etc.

The phase change layer may have an amorphous state with a relatively high resistance and a crystalline state with a relatively low resistance. The phase change layer may have phases that are changed through Joule heating that is generated based on the amount of current and cooling time.

Each of the memory cells may include a single level cell that is configured to store one bit of data. In this case, the memory cell may have two resistance distributions based on the stored data. Alternatively, each of the memory cells may include a multi-level cell that is configured to store no less than two bits of data. In this case, the memory cell may have four or eight resistance distributions based on stored data.

Referring again to FIG. 2, the control circuit block CB may include a column selection circuit 120, a row selection circuit 130, a control signal generation circuit 140, a write driver WD and a detection circuit 180.

The column selection circuit 120 may be connected between a global bit line GBL and a plurality of bit lines BL<0:m>. The column selection circuit 120 may be configured to connect a selected bit line among the bit lines BL<0:m> with the global bit line GBL. The bit line may be selected by using a column address CADD that is provided by the control signal generation circuit 140. The column selection circuit 120 may include at least one global column switch and at least one local column switch that are connected between the global bit line GBL and the bit line BL in series. For example, the global column switch may include a MOS transistor that is configured to be turned-on in response to a global bit line selection signal. The local column switch may include a MOS transistor that is configured to be turned-on in response to a local bit line selection signal. The global bit line selection signal and the local bit line selection signal may be generated in the column selection circuit 120 by using the column address CADD.

The row selection circuit 130 may be connected between a global word line GWL and a plurality of word lines WL<0:n>. The row selection circuit 130 may be configured to connect a selected word line among the word lines WL<0:n> with the global word line GWL. The word line may be selected by using a row address RADD that is provided from the control signal generation circuit 140. The row selection circuit 130 may include at least one global row switch and at least one local row switch that are connected between the global word line GWL and the word line WL in series. For example, the global row switch may include a MOS transistor that is configured to be turned-on in response to a global word line selection signal. The local row switch may include a MOS transistor that is configured to be turned-on in response to a local word line selection signal. The global word line selection signal and the local word line selection signal may be generated in the row selection circuit 130 by using the row address RADD.

A memory cell that is connected between the bit line and the word line, which may be selected by the column selection circuit 120 and the row selection circuit 130, may be selected. A write operation and a read operation may then be performed on the selected memory cell.

The control signal generation circuit 140 may be configured to output variable control signals to drive the variable resistive memory device PCM. The control signal generation circuit 140 may receive the command CMD, the address ADD, the data DATA, the control signal CTRL and the position address information ADD_info from the controller 50 in FIG. 1 to generate the control signals.

The control signal generation circuit 140 may include a write control unit 150, The write control unit 150 may receive at least one of the command CMD, the address ADD, the data DATA, the control signal CTRL and the position address information ADD_info to generate a pre-charge set signal PC and a pre-selection set signal PS, For example, when the memory cell in the first group 110a is selected in response to the command CMD, the address ADD and the position address information ADD_info, the write control unit 150 may output the pre-selection set signal PS. Further, when the memory cell in the second group 110b is selected in response to the command CMD, the address ADD and the position address information ADD_info, the write control unit 150 may output the pre-charge set signal PC.

The control signal generation circuit 140 may generate the column address CADD and the row address RADD based on the address ADD. The control signal generation circuit 140 may select the memory cell based on the column address CADD and the row address RADD.

The write driver WD may receive the control signal from the control signal generation circuit 140 to perform the write operation on the selected memory cell. The write driver WD may receive the pre-selection signal PS and the pre-charge signal PC to perform the write operation based on positions of selected memory cells in different ways.

For example, when the memory cell in the first group 110a is selected, the write driver WD may receive the enabled pre-selection signal PS. Thus, the write operation may then be performed on the selected memory cell based on a pre-selection way. The write operation based on the pre-selection way may include applying a minimum voltage (hereinafter, referred to as a pre-selection voltage) and a minimum current (hereinafter, referred to as a pre-selection current) for turning-on the selected memory cell to the selected memory cell, and applying a write voltage (reset voltage or a set voltage) to the selected memory cell after generating the turning-on or the snapback of the selected memory cell. Thus, after the turning-on or the snapback, the pre-selection voltage lower than the write voltage may be applied to the selected memory cell and the pre-selection current lower than the write current may flow through the selected memory cell. Because the write voltage and the write current may be applied to the selected memory cell, a fail of the memory cell, which may be caused by a spike or an overshoot due to a sudden applying of the write voltage may be reduced. Particularly, because the memory cells in the first group 110a may be adjacent to the control circuit block CB, the spike and the overshoot may be frequently generated in the memory cells in the first group 110a compared to the memory cells in the second group 110b. Therefore, the write operation may be effectively performed without the fail of the memory cell.

In contrast, when the memory cell in the second group 110b is selected, the write driver WD may receive the enabled pre-charge signal PC. Thus, the write operation may then be performed on the selected memory cell based on a pre-charge way. The write operation based on the pre-charge way may include applying a pre-charge voltage lower than the write voltage to the selected memory cell, and applying the write voltage to the selected memory cell after generating the turning-on or the snapback of the selected memory cell. The pre-charge voltage may be higher than the pre-selection voltage and lower than the write voltage. Thus, after the turning-on or the snapback, because a voltage approximate to the write voltage may be previously applied to the selected memory cell, a boost-up may be readily performed to the write voltage. Particularly, because the second group 110b may be remote in relation to the control circuit block CB, the write operation may be rapidly changed to decrease an operational time of the write operation.

The write driver WD may include a first control circuit 160 and a second control circuit 170 to perform the pre-selection operation and the pre-charge operation based on the positions of the 21' memory cells.

The first control circuit 160 may receive a reset write signal RWT, a set write signal SWT, the pre-selection signal PS and the pre-charge signal PC to provide the global bit line GBL with any one of a first reset voltage, a first set voltage, a first pre-selection voltage and a first pre-charge voltage. The first control circuit 160 may be illustrated later in detail.

The second control circuit 170 may receive the reset write signal RWT, the set write signal SWT, the pre-selection signal PS and the pre-charge signal PC to provide the global word line GWL with any one of a second reset voltage, a second set voltage, a second pre-selection voltage and a second pre-charge voltage. The second control circuit 170 may be illustrated later in detail.

The detection circuit 180 may be configured to detect the turning-on of the selected memory cell. When the selected memory cell is turned-on, the detection circuit 180 may provide the control signal generation circuit 140 with a detection signal Dout. For example, the detection circuit 180 may include a sense amplifier that is connected to the global word line GWL.

For example, the write voltage may be applied to the bit line and the word line that are connected to the selected memory cell in response to the write signal, for example, the reset write signal RWT or the set write signal SWT. When a voltage difference that corresponds to a critical voltage is generated between the selected bit line and the selected word line, the memory cell may be turned-on to rapidly increase the write current. The detection circuit 180 may enable the detection signal Dout at a point of the rapid increasing of the write current.

Figure 5:
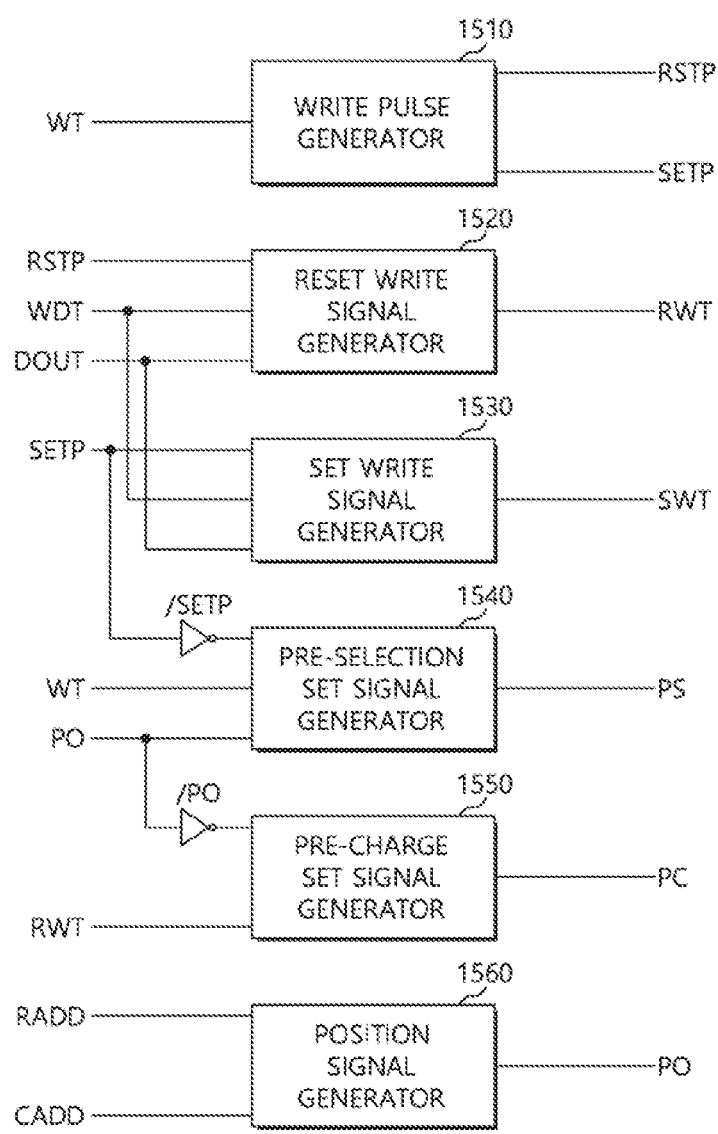
FIG. 5 is a block diagram, illustrating a write control unit, in accordance with example embodiments.
Figure 6:
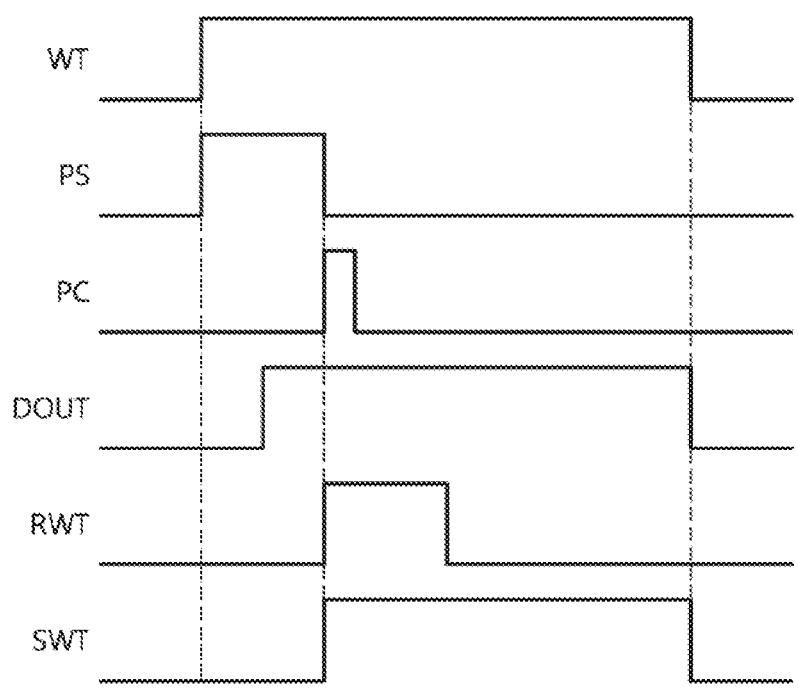
FIG. 6 is a timing chart, illustrating operations of a write control unit, in accordance with example embodiments.

FIG. 5 is a block diagram illustrating a write control unit, in accordance with example embodiments. Furthermore, FIG. 6 is a timing chart illustrating operations of a write control unit, in accordance with example embodiments.

Referring to FIG. 5, the write control unit 150 may include a write pulse generator 1510, a reset write signal generator 1520, a set write signal generator 1530, a pre-selection set signal generator 1540, a pre-charge set signal generator 1550 and a position signal generator 1560.

The write pulse generator 1510 may be configured to generate a reset pulse signal RSTP and a set pulse signal SETP based on the write signal WT. The reset pulse signal RSTP may have a pulse width for defining duration of the reset write operation. The set pulse signal SETP may have a pulse width for defining duration of the set write operation. The pulse width of the set pulse signal SETP may be longer than the pulse width of the reset pulse signal RSTP. The write pulse generator 1510 may generate the reset pulse signal RSTP and the set pulse signal SRTP after elapsing a predetermined time when the write signal is enabled. The predetermined time may correspond to a time at which the pre-selection operation or the pre-charge operation may be performed after applying the write signal WT.

The reset write signal generator 1520 may receive the reset pulse signal RSTP, the write data WDT and the detection signal DOUT to generate the reset write signal RWT. For example, when the write data WDT includes reset data, the write data WDT may have a logic low level. For example, when the write data WDT includes set data, the write data WDT may have a logic high level. When the write data WDT is at a logic low level and the detection signal DOUT may be enabled to the logic high level, the reset write signal generator 1520 may output the reset pulse signal RSTP as the reset write signal RWT. When the inverted write data WDT and the detection signal DOUT are at a logic high level, the reset write signal generator 1520 may output the reset pulse signal RSTP as the reset write signal RWT. The reset write signal generator 1520 may include various logic circuits that are configured to perform logic AND operations.

The set write signal generator 1530 may receive the set pulse signal SETP, the write data WDT and the detection signal DOUT to generate the set write signal RWT. For example, when the write data WDT is at a logic low level and the detection signal DOUT may be enabled to the logic high level, the set write signal generator 1530 may output the set pulse signal SETP as the set write signal SWT. The set write signal generator 1530 may include various logic circuits that are configured to perform logic AND operations.

The pre-selection set signal generator 1540 may receive the write signal WT, the set pulse signal SETP and a position signal PO to generate the pre-selection set signal PS. For example, the position signal PO may be generated from the position signal generator 1560 in the write control unit 150. The position signal generator 1560 may receive the column address CADD and the row address RADD to determine a position of a selected memory cell selected based on the column address CADD and the row address RADD. When the selected memory cell corresponds to the first group 110a in FIG. 2, the position signal generator 1560 may output the position signal PO with the logic high level. In contrast, when the selected memory cell corresponds to the second group 110b in FIG. 2, the position signal generator 1560 may output the position signal PO with the logic low level.

When the set pulse signal SETP is enabled, the pre-selection set signal generator 1540 may disable the pre-selection set signal PS. Because the set pulse signal SETP may be enabled after the write signal WT may be enabled and the duration of the pre-selection operation may be elapsed, the set pulse signal SETP may be used for determining a disable timing of the pre-selection set signal PS. Alternatively, the pre-selection set signal generator 1540 may disable the pre-selection set signal PS based on the reset pulse signal RSTP in place of the set pulse signal SETP. The pre-selection set signal generator 1540 may generate the pre-selection set signal PS based on at least one of the write signal WT, the set pulse signal SETP and the reset pulse signal RSTP, and the position signal PO. For example, when the write signal WT, an inverted set pulse signal/SETP and the position signal PO is at a logic high level, the pre-selection set signal generator 1540 may output the pre-selection set signal PS enabled to a high level. The pre-selection set signal generator 1540 may include various logic circuits that are configured to perform logic AND operations.

The pre-charge set signal generator 1550 may receive the reset write signal RWT and the position signal PO to generate the pre-charge set signal PC. When the position signal PO is at a logic low level and the reset write signal RWT may be enabled to a high level, the pre-charge set signal PC may be a signal temporarily enabled to a high level. The pre-charge set signal generator 1550 may include various logic circuits.

Referring to FIG. 6, when the write operation of the phase change memory device PCM is performed, the write signal WT may be enabled. When the write signal WT is enabled, the pre-selection set signal generator 1540 may output the pre-selection set signal PS based on the positions of the selected memory cell.

The write operation, in accordance with the pre-selection way or the pre-charge way, may be performed on the selected memory cell in response to the pre-selection set signal PS or the pre-charge set signal PC. When the selected memory cell is turned-on (i.e., snapbacked), the detection circuit 180 may enable the detection signal DOUT.

When the detection signal DOUT is enabled, the write pulse generator 1510 may enable the reset pulse signal RSTP and the set pulse signal SETP.

When the set pulse signal SETP is enabled, the pre-selection set signal generator 1540 may disable the pre-selection set signal PS and the pre-charge set signal PC.

When the write data WDT is the reset data, the reset write signal generator 1520 may output the reset pulse signal RSTP as the reset write signal RWT. In contrast, when the write data WDT is the set data, the set write signal generator 1530 may output the set pulse signal SETP as the set write signal SWT.

When the reset write signal RWT is enabled, the pre-charge set signal generator 1550 may generate the pre-charge set signal PC enabled in a pulse shape.

Figure 7:
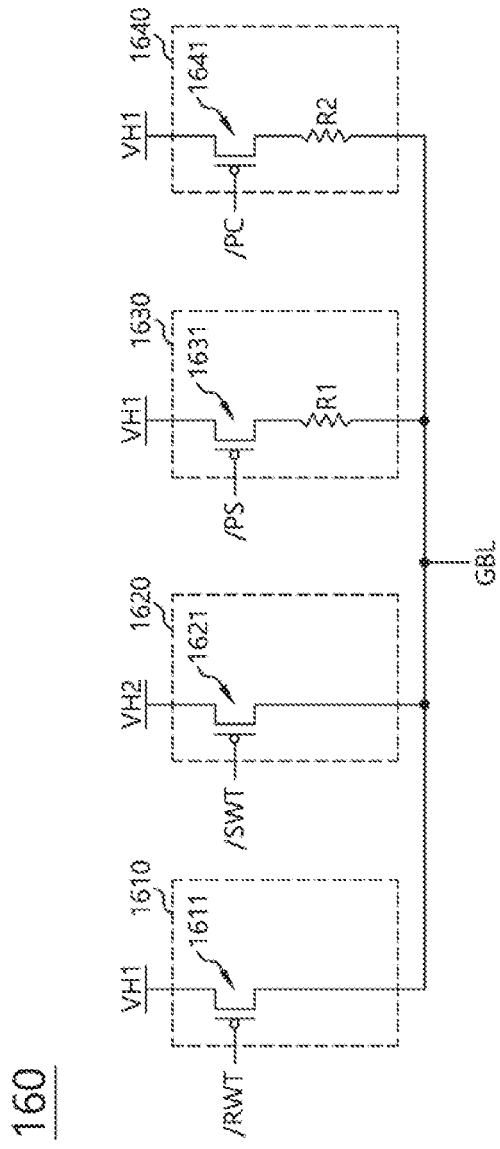
FIG. 7 is a circuit diagram, illustrating a first control circuit, in accordance with example embodiments.

FIG. 7 is a circuit diagram illustrating a first control circuit, in accordance with example embodiments.

Referring to FIG. 7, the first control circuit 160 may include a first reset voltage generator 1610, a first set voltage generator 1620, a first pre-selection voltage generator 1630 and a first pre-charge voltage generator 1640.

The first reset voltage generator 1610 may receive a first high power voltage VH1 and an inverted reset write signal/RWT. The first reset voltage generator 1610 may provide the global bit line GBL with the first high power voltage VH1 as a first reset voltage in response to the inverted reset write signal/RWT. The first reset voltage generator 1610 may include a PMOS transistor 1611. The PMOS transistor 1611 may include a gate that is configured to receive the inverted reset write signal/RWT, a source that is configured to receive the first high power voltage VH1, and a drain that is connected to the global bit line GBL.

The first set voltage generator 1620 may receive a second high power voltage VH2 lower than the first high power voltage VH1 and an inverted set write signal/SWT. The first set voltage generator 1620 may provide the global bit line GBL with the second high power voltage VH2 as a first set voltage in response to the inverted set write signal/SWT. The first set voltage generator 1620 may include a PMOS transistor 1612. The PMOS transistor 1612 may include a gate that is configured to receive the inverted set write signal/SWT, a source that is configured to receive the second high power voltage VH2, and a drain that is connected to the global bit line GBL. In example embodiments, the first high power voltage VH1 and the second high power voltage VH2 may have positive voltage levels.

The first pre-selection voltage generator 1630 may provide the global bit line GBL with a first pre-selection voltage in response to an inverted pre-selection set signal/PS. The first pre-selection voltage may have a level that is lower than the first reset voltage or the first set voltage. In example embodiments, conveniences for explanations, reset data may be pre-selected and pre-charged exemplarily. The first pre-selection voltage generator 1630 may include a PMOS transistor 1631 and a first resistance R1. The PMOS transistor 1631 may include a gate that is configured to receive the inverted pre-selection set signal/PS, a source that is configured to receive the first high power voltage VH1, and a drain that is connected to the first resistance R1. The PMOS transistor 1631 may transmit the high power voltage VH1 to the drain of the PMOS transistor 1631 in response to the inverted pre-selection set signal/PS. The first resistance R1 may drop the level of the high power voltage VH1 to provide the global bit line GBL with the first pre-selection voltage as the minimum voltage for turning-on the memory cell. In example embodiments, the first high power voltage VH1 may be used as a driving power for the first pre-selection voltage generator 1630. Alternatively, a power with a level that is lower than that of the first high power voltage VH1 may be used for the driving power of the first pre-selection voltage generator 1630.

The first pre-charge voltage generator 1640 may provide the global bit line GBL with a first pre-charge voltage in response to an inverted pre-charge set signal/PC. The first pre-charge voltage may have a level that is lower than the first reset voltage and higher than the first pre-selection voltage. Thus, the pre-charge voltage generator 1640 may use the high power voltage VH1 or an additional high power voltage. The first pre-charge voltage generator 1640 may include a PMOS transistor 1641 and a second resistance R2. The PMOS transistor 1641 may include a gate that is configured to receive the inverted pre-charge set signal/PC, a source that is configured to receive the first high power voltage VH1, and a drain that is connected to the second resistance R2. The PMOS transistor 1641 may transmit the high power voltage VH1 to the drain of the PMOS transistor 1641 in response to the inverted pre-charge set signal/PC. The second resistance R2 may drop the level of the high power voltage VH1 to provide the global bit line GBL with the first pre-charge voltage for pre-charging the memory cell.

In example embodiments, in order to provide the first pre-selection voltage with the level that is lower than the level of the first pre-charge voltage, the first resistance R1 may be higher than the second resistance R2.

Figure 8:
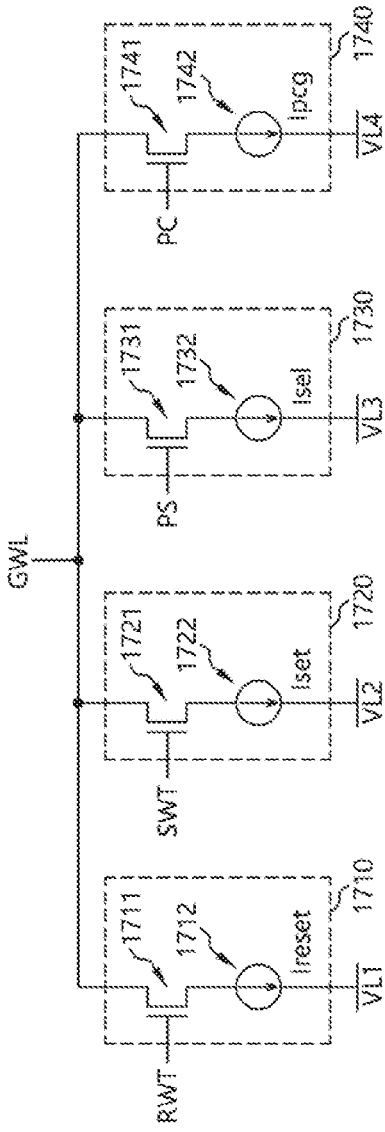
FIG. 8 is a circuit diagram, illustrating a second control circuit, in accordance with example embodiments.

FIG. 8 is a circuit diagram, illustrating a second control circuit, in accordance with example embodiments.

Referring to FIG. 8, the second control circuit 170 may include a second reset voltage generator 1710, a second set voltage generator 1720, a second pre-selection voltage generator 1730, and a second pre-charge voltage generator 1740.

The second reset voltage generator 1710 may provide the global word line GWL with a second reset voltage based on the reset write signal RWT. Further, the second reset voltage generator 1710 may supply a reset current Ireset through the global word line GWL. The second reset voltage generator 1710 may include an NMOS transistor 1711 and a current source 1712. The NMOS transistor 1711 may include a gate that is configured to receive the reset write signal RWT, a source that is connected to the current source 1712, and a drain that is connected to the global word line GWL. The current source 1712 may include a positive current source that is configured to supply the reset current Ireset. The current source 1712 may be connected between the source of the NMOS transistor 1711 and a terminal of a first lower power voltage VL1.

When the reset write signal RWT is enabled, the NOMS transistor 1711 may connect the current source 1712 with the global word line GWL. Further, when the NOMS transistor 1711 is turned-on, the first lower power voltage VL1 as the second reset voltage may be provided to the global word line GWL. When the NMOS transistor 1711 is turned-on, the reset current Ireset may flow through the global word line GWL. The first lower power voltage VL1 may have a negative voltage level. For example, the memory cell may be phase-changed into a reset state based on a difference between the first reset voltage and the second reset voltage.

The second set voltage generator 1720 may provide the global word line GWL with a second set voltage in response to the set write signal SWT. The second set voltage generator 1720 may supply a set current Iset to the global word line GWL.

The second set voltage generator 1720 may include an NMOS transistor 1721 and a current source 1722. The NMOS transistor 1721 may include a gate that is configured to receive the set write signal SWT, a source that is connected to the current source 1722, and a drain that is connected to the global word line GWL. The current source 1722 may be connected between the source of the NMOS transistor 1721 and a terminal of a second lower power voltage VL2. The second low power voltage VL2 may have a negative voltage level. The second low power voltage VL2 may have an absolute value that is lower than that of the first lower power voltage VL1.

When the set write signal SWT is enabled, the NOMS transistor 1721 may connect the current source 1722 with the global word line GWL. Further, when the NOMS transistor 1721 is turned-on, the second lower power voltage VL2 as the second set voltage may be provided to the global word line GWL. When the NMOS transistor 1721 is turned-on, the set current Iset may flow through the global word line GWL.

The second pre-selection voltage generator 1730 may provide the global word line GWL with a second pre-selection voltage in response to the pre-selection set signal PS. The second pre-selection voltage generator 1730 may supply a pre-selection current Isel to the global word line GWL. The second pre-selection voltage generator 1730 may include an NMOS transistor 1731 and a current source 1732. The NMOS transistor 1731 may include a gate that is configured to receive the pre-selection set signal PS, a source that is connected to the current source 1732, and a drain that is connected to the global word line GWL.

The current source 1732 may include a positive current source that is configured to supply the pre-selection current Isel. The current source 1732 may be connected between the source of the NMOS transistor 1731 and a terminal of a third low power voltage VL3. The third low power voltage VL3 may include a power voltage for generating a second pre-selection voltage. Alternatively, the first low power voltage VL1 or the second low power voltage VL2 in place of the third low power voltage VL3 may be used.

When the NMOS transistor 1731 is turned-on by the pre-selection set signal PS, the current source 1732 may supply the pre-selection current Isel to the global word line GWL. Further, when the NMOS transistor 1731 is turned-on, the third low power voltage as the second pre-selection voltage may be provided to the global word line GWL. The second pre-selection voltage may have a negative voltage level. The second pre-selection voltage may have an absolute value that is lower than the absolute values of the first and second low power voltages VL1 and VL2.

The second pre-charge voltage generator 1740 may provide the global word line GWL with a second pre-charge voltage in response to the pre-charge set signal PC. The second pre-charge voltage generator 1740 may supply a pre-charge current Ipcg to the global word line GWL. The pre-charge current Ipcg may function as to reduce a rising time of the reset write signal RWT. As mentioned above, because the pre-charge set signal PC may be temporarily turned-on in response to the reset write signal RWT, the pre-charge current Ipcg may be provided with decreasing an overshoot of the reset write current.

The second pre-charge voltage generator 1740 may include an NMOS transistor 1741 and a current source 1742. The NMOS transistor 1741 may include a gate that is configured to receive the pre-charge set signal PC, a source that is connected to the current source 1742, and a drain that is connected to the global word line GWL.

The current source 1742 may include a positive current source that is configured to supply the pre-charge current Ipcg. The current source 1742 may be connected between the source of the NMOS transistor 1741 and a terminal of a fourth low power voltage VL4.

When the NMOS transistor 1741 is turned-on by the pre-charge set signal PC, the current source 1742 may supply the pre-charge current Ipcg to the global word line GWL. Further, when the NMOS transistor 1741 is turned-on, the fourth low power voltage VL4 as the second pre-charge voltage may be provided to the global word line GWL. The second pre-selection voltage may have a negative voltage level. The second pre-selection voltage may have an absolute value that is lower than an absolute value of the second reset voltage and higher than an absolute value of the second pre-selection voltage.

Figure 9:
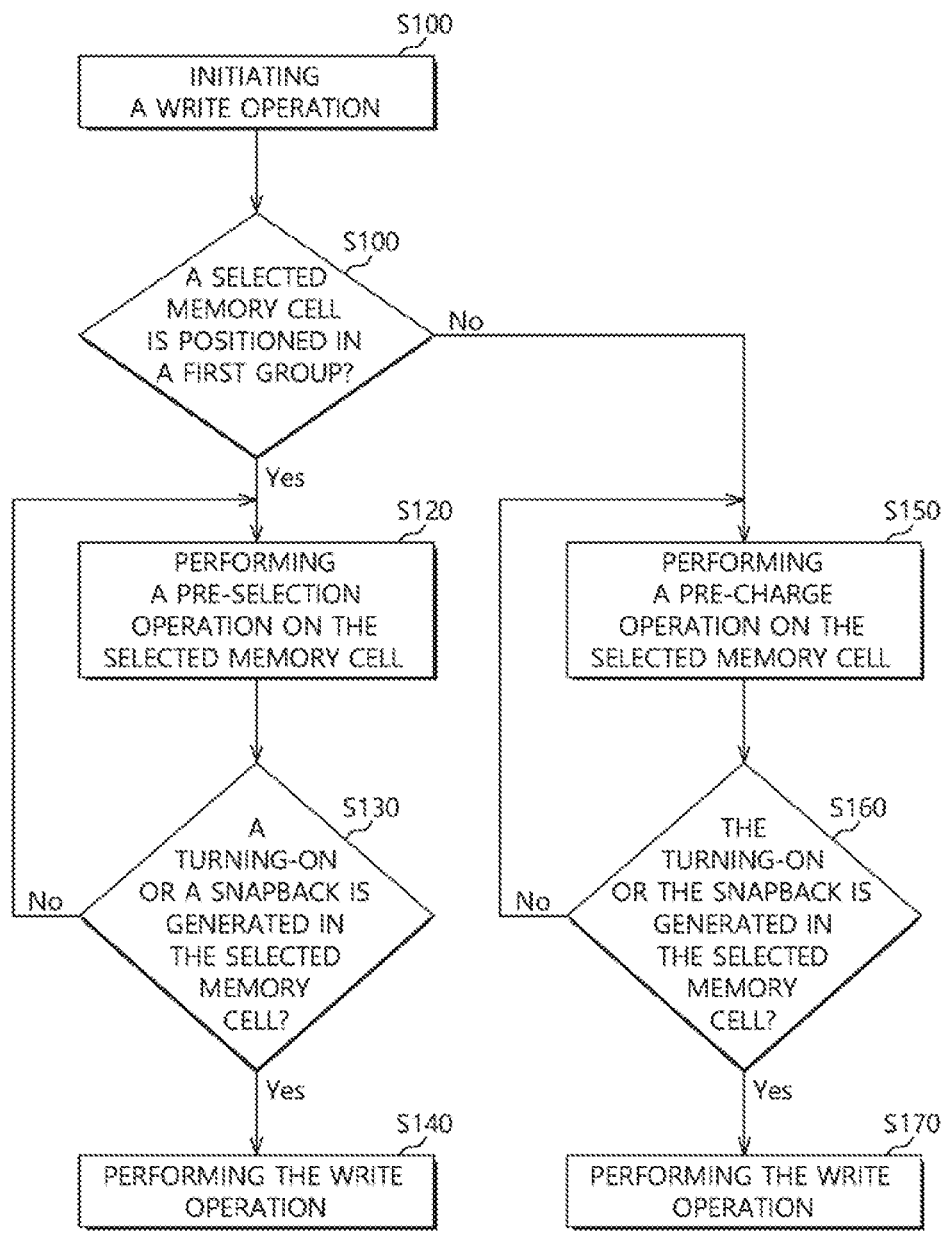
FIGS. 9 and 10 are flow charts, illustrating operations of a phase change memory device, in accordance with example embodiments.
Figure 10:
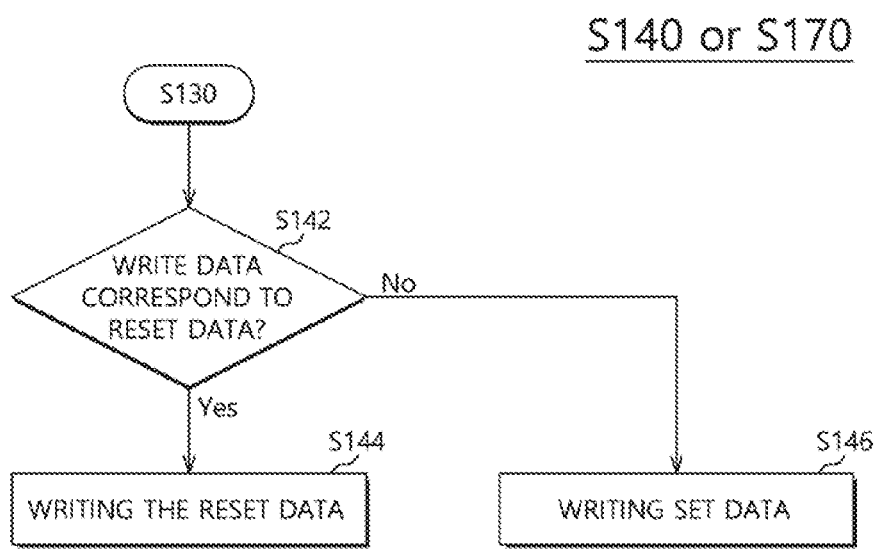

FIGS. 9 and 10 are flow charts illustrating operations of a phase change memory device based on example embodiments.

Referring to FIGS. 1 to 10, in step S100, the write operation of the phase change memory device PCM may be performed in response to the write command. As mentioned above, the phase change memory device PCM may select a specific memory cell MC based on the column address CADD and the row address RADD.

In step S110, the position signal generator 1550 of the write control circuit 150 may generate the position signal PO for representing the selected memory cell in the first group 110a based on the column address CADD and the row address RADD.

In step S120, when the selected memory cell is positioned in the first group 110a, the position signal PO may be enabled to a high level. The write control unit 150 may enable the pre-selection set signal PS in response to the enabled position signal PO. The pre-selection operation may be performed on the selected memory cell by enabling the pre-selection set signal PS before turning-on the selected memory cell.

In step S130, the detection circuit 180 may detect a point of the turning-on or the snapback of the selected memory cell on which the pre-selection operation may be performed to output the enabled detection signal DOUT. When the turning-on or the snapback of the selected memory cell is not generated, the selected memory cell may again perform the pre-selection operation.

In step S140, the write control unit 150, the first control circuit 160 and the second control circuit 170 may perform the write operation on the selected memory cell based on the turning-on or the snapback of the selected memory cell and the write data WDT.

Performing the write operation may include identifying whether the write data WDT may correspond to the reset data or the set data in step S142, and applying the reset current Ireset to the selected memory cell to write the reset data in the selected memory cell when the write data WDT corresponds to the reset data in step S144.

In contrast, when the write data WDT corresponds to the set data, in step S146, the set current Iset may be applied to the selected memory cell to write the set data in the selected memory cell.

In step S150, when the selected memory cell is positioned in the second group 110b, the position signal PO may be disabled. The write control unit 150 may enable the pre-charge set signal PC in response to the position signal PO disabled to a low level. The pre-charge operation may be performed on the selected memory cell by enabling the pre-charge set signal PC.

In step S160, the detection circuit 180 may detect the point of the turning-on or the snapback of the selected memory cell on which the pre-charge operation may be performed to output the enabled detection signal DOUT. In contrast, when the turning-on or the snapback of the selected memory cell is not generated, the pre-charge operation may be again performed on the selected memory cell.

In step S170, the write control unit 150, the first control circuit 160 and the second control circuit 170 may selectively perform the reset write operation and the set write operation on the selected memory cell based on the turning-on or the snapback of the selected memory cell and the write data WDT.

The write operation of the pre-charged memory cell may be substantially the same as the write operation of the pre-selected memory cell.

FIG. 11 is a view diagram illustrating a pre-selection operation and a pre-charge operation, in accordance with example embodiments. In example embodiments, the write data may correspond to the reset data. In FIG. 11, a line (a) may represent the pre-selection operation and a line (b) may represent the pre-charge operation.

Referring to FIG. 11, as shown by line (a), when the write operation of the phase change memory device 100 is performed and the selected memory cell is positioned in the first group 110a, the second control circuit 170 may apply the second pre-selection voltage to the global word line GWL based on the pre-selection set signal PS. The second control circuit 170 may transmit the pre-selection current Isel to the memory cell through the global word line GWL. The first control circuit 160 may apply the first pre-selection voltage to the global bit line GBL based on the pre-selection set signal PS. The difference between the first pre-selection voltage and the second pre-selection voltage may correspond to the minimum voltage for turning-on the memory cell.

When the difference between the first pre-selection voltage and the second pre-selection voltage reaches the minimum voltage while the pre-selection current flows through the selected memory cell, the turning-on or the snapback of the selected memory cell may be generated.

When the turning-on or the snapback of the selected memory cell is generated, an instantaneous spike current Ispike may flow through the selected memory cell. The detection circuit 180 may enable the detection signal DOUT at a generation point of the spike current Ispike.

After generating the spike current Ispike, the pre-selection current Isel may flow through the memory cell until the reset current may be applied to the memory cell. During applying the pre-selection current Isel, a voltage level of the global bit line GBL may be decreased and a voltage level of the global word line GWL may be increased.

The write control unit 150 may enable the reset write signal RWT by enabling the detection signal DOUT. The first control circuit 160 may apply the first reset voltage VH1 to the global bit line GBL. The second control circuit 170 may apply the second reset voltage VL1 to the global word line GWL to provide the global word line GWL with the reset current Ireset. The difference between the first reset voltage VH1 and the second reset voltage VL1 may correspond to the reset voltage for resetting the memory cell. Thus, the reset current Ireset may flow through the selected memory cell so that the selected memory cell may be programmed to a high resistance state.

As mentioned above, because the voltage of the global bit line GBL may be temporarily dropped during the turning-on of the selected memory cell and applying the first reset voltage VH1, the spike and the overshoot in the memory cell, which may be adjacent to the control circuit block CB, caused by the rapid change of the voltage may be reduced between the first pre-selection voltage and the first reset voltage VH1.

When the reset write signal RWT is be disabled, the voltage level of the global bit line GBL may be decreased and the voltage level of the global word line GWL may be increased. When the write signal WT is disabled, the write operation may be finished.

As shown by line (b), when the write operation of the phase change memory device 100 is performed and the selected memory cell is positioned in the second group 110b, the second control circuit 170 may apply the second pre-charge voltage VL4 to the global word line GWL based on the pre-charge set signal PC. The second control circuit 170 may transmit the pre-charge current Ipcg to the memory cell through the global word line GWL. The first control circuit 160 may apply the first pre-charge voltage to the global bit line GBL based on the pre-charge set signal PC. The difference between the first pre-charge voltage and the second pre-charge voltage (hereinafter, referred to as a pre-charge voltage) may be higher than the minimum voltage and lower than the reset voltage.

When the difference between the first pre-charge voltage and the second pre-charge voltage is no less than the minimum voltage while the pre-charge current flows through the selected memory cell, the turning-on or the snapback of the selected memory cell may be generated.

When the turning-on or the snapback of the selected memory cell is generated, an instantaneous spike current Ispike may flow through the selected memory cell. The detection circuit 180 may enable the detection signal DOUT at a generation point of the spike current Ispike.

The write control unit 150 may enable the reset write signal RWT by enabling the detection signal DOUT. The first control circuit 160 may apply the first reset voltage VH1 to the global bit line GBL. The second control circuit 170 may apply the second reset voltage VL1 to the global word line GWL to provide the global word line GWL with the reset current Ireset. Thus, the reset current Ireset may flow through the selected memory cell so that the selected memory cell may be programmed to a high resistance state.

Because the first pre-charge voltage may be applied to the global bit line GBL, the voltage level may be rapidly changed into the first reset voltage VH1. Further, because the selected memory cell may be turned-on with applying the pre-charge current to the selected memory cell, the current level may also be rapidly changed into the reset current.

Therefore, the reset conversion speed of the memory cell in the second group 110b that is remote in relation to the control circuit block CB may be improved.

When the reset write signal RWT is disabled, the voltage level of the global bit line GBL may be decreased and the voltage level of the global word line GWL may be increased. When the write signal WT is disabled, the write operation may be finished.

In example embodiments, the above-mentioned operation may be applied to the set operation as well as the reset operation.

According to example embodiments, the write operation by using the pre-selection way may be performed on the memory cells that are adjacent to the control circuit block. In contrast, the write operation by using the pre-charge way may be performed on the memory cells that are remote in relation to the control circuit block.

Therefore, the fail and the disturbance caused by the rapid voltage change when applying the reset voltage to the memory cells that are adjacent to the control circuit block may be reduced. The reset operation may be performed on the memory cells that are remote in relation to the control circuit block during applying the voltage to the remote memory cells to ensure a signal delay and a reset time. As a result, problems of a non-uniform write operation caused by the positions of the memory cells may be solved.

The above described embodiments of the present invention are intended to illustrate and not to limit the present invention. Various alternatives and equivalents are possible. The invention is not limited by the embodiments described herein. Nor is the invention limited to any specific type of semiconductor device. Another additions, subtractions, or modifications are obvious in view of the present disclosure and are intended to fall within the scope of the appended claims.

What is claimed is:

1. A variable resistive memory device comprising:
a memory cell array with a plurality of memory cells that are connected between a global word line and a global bit line; and
a control circuit block positioned on at least one edge portion of the memory cell array,
wherein the memory cell array is classified into a first group with the memory cells that are adjacent to the control circuit block and a second group with the memory cells that are remote in relation to the control circuit block, wherein the second group is farther from the control circuit block than the first group, and
wherein the control circuit block comprises a write control unit that is configured to generate a control signal for writing on the memory cells in the first group in a different way compared to writing on the memory cells in the second group.

2. The variable resistive memory device of claim 1, wherein the write control unit is configured to output a pre-selection set signal when the memory cell in the first group is selected and configured to output a pre-charge set signal when the memory cell in the second group is selected.

3. The variable resistive memory device of claim 1, wherein the control circuit block further comprises a detection circuit that is configured to detect a turning-on of the selected memory cell based on a current of the selected memory cell and to output a detection signal.

4. The variable resistive memory device of claim 3, wherein the write control unit is configured to output a pre-selection set signal after enabling the detection signal and configured to output a write signal before enabling the detection signal when the memory cell in the first group is selected, and
wherein the write control unit is configured to output a pre-charge set signal after enabling the detection signal and configured to output the write signal before enabling the detection signal when the memory cell in the second group is selected.

5. The variable resistive memory device of claim 4, wherein the control circuit block further comprises a write driver that is configured to applying a voltage and a current for a writing operation to the memory cell in response to the pre-selection set signal, the pre-charge set signal, and the write signal of the write controller.

6. The variable resistive memory device of claim 5, wherein the write driver comprises a first control circuit that is connected between the control circuit block and the global bit line to selectively output a first reset voltage, a first set voltage, a first pre-selection voltage, and a first pre-charge voltage to the global bit line based on the pre-selection set signal, the pre-charge set signal and the write signal of the write controller, and
wherein the first reset voltage, the first set voltage, the first pre-selection set voltage and the first pre-charge voltage have different positive levels.

7. The variable resistive memory device of claim 6, wherein the write driver comprises a second control circuit that is connected between the control circuit block and the global word line to selectively apply a second reset voltage, a second set voltage, a second pre-selection voltage and a second pre-charge voltage to the global word line based on the pre-selection set signal, the pre-charge set signal and the write signal of the write controller, and to provide the global word line with any one of a reset current, a set current, a pre-selection current and a pre-charge current, and
wherein the second reset voltage, the second set voltage, the second pre-selection set voltage and the second pre-charge voltage have different negative levels.

8. The variable resistive memory device of claim 7, wherein a pre-selection voltage, corresponding to a difference between the first pre-selection voltage and the second pre-selection voltage, corresponds to a minimum voltage for turning-on the memory cell.

9. The variable resistive memory device of claim 7, wherein a pre-charge voltage that corresponds to a difference between the first pre-charge voltage and the second pre-charge voltage is lower than a difference between the first reset voltage and the second reset voltage and higher than the first pre-selection voltage and the second pre-selection voltage.

10. A variable resistive memory device comprising:
a memory cell array with a plurality of memory cells that are connected between a global word line and a global bit line; and
a control circuit block configured to control operations of the memory cells,
wherein the control circuit block comprises:
a write circuit configured to apply a pre-selection current to the memory cell and to apply a write current to the memory cell after turning-on the memory cell based on a position of a selected memory cell, or to apply a pre-charge current, which is different from the pre-selection current, to the memory cell and to apply the write current to the memory cell after turning-on the memory cell based on the position of the selected memory cell; and a detection circuit connected to the global word line to detect a current of the selected memory cell and to enable a detection signal when turning-on the selected memory cell.

11. The variable resistive memory device of claim 10, wherein the pre-selection current is a minimum current for turning-on the memory cell, and
wherein pre-charge current is higher than the minimum current and lower than the write current.

12. The variable resistive memory device of claim 10, wherein the write circuit comprises:
a write control unit configured to selectively output a pre-selection set signal and a pre-charge set signal based on the position of the selected memory cell and configured to output a write signal in response to the enabled detection signal; and
a write driver configured to apply the pre-selection current and the pre-selection voltage to the selected memory cell in response to the pre-selection set signal, configured to apply the pre-charge current and the pre-charge voltage to the selected memory cell in response to the pre-charge set signal, and configured to apply a write voltage to the selected memory cell in response to the write signal,
wherein the write signal comprises a reset write signal and a set write signal, and the write voltage comprises a reset write voltage and a set write voltage that is lower than the reset write voltage.

13. The variable resistive memory device of claim 12, wherein the write control unit comprises:
a write pulse generator configured to generate a reset pulse signal and a set pulse signal based on the write signal;
a reset write signal generator configured to generate the reset write signal in response to write data, the reset pulse signal, and the detection signal;
a set write signal generator configured to generate the set write signal in response to the write data, the set pulse signal, and the detection signal;
a pre-selection set signal generator configured to generate the pre-selection set signal in response to the write signal, an inverted set pulse signal, and a position signal, representing the position of the selected memory cell; and
a pre-charge set signal generator configured to generate the pre-charge set signal in response to the write signal, the inverted set pulse signal, and the position signal.

14. The variable resistive memory device of claim 13, wherein the write driver comprises:
a first control circuit configured to selectively output a first reset voltage, a first set voltage, a first pre-selection voltage, and a first pre-charge voltage to the global bit line based on the reset write signal, the set write signal, the pre-selection set signal, and the pre-charge set signal; and
a second control circuit configured to selectively apply a second reset voltage, a second set voltage, a second pre-selection voltage, and a second pre-charge voltage to the global word line based on the reset write signal, the set write signal, the pre-selection set signal, and the pre-charge set signal, and to provide the global word line with any one of a reset current, a set current, a pre-selection current, a pre-charge current, and the second reset voltage,
wherein the first reset voltage, the first set voltage, the first pre-selection set voltage, and the first pre-charge voltage have different positive levels, and the second reset voltage, the second set voltage, the second pre-selection set voltage and the second pre-charge voltage have different negative levels.

15. The variable resistive memory device of claim 14, wherein a pre-selection voltage, corresponding to a difference between the first pre-selection voltage and the second pre-selection voltage, corresponds to a minimum voltage for turning-on the memory cell.

16. The variable resistive memory device of claim 14, wherein a pre-charge voltage, corresponding to a difference between the first pre-charge voltage and the second pre-charge voltage, is lower than a difference between the first reset voltage and the second reset voltage and higher than the first pre-selection voltage and the second pre-selection voltage.

17. A method of operating a variable resistive memory device, the method comprising:
identifying a position of a selected memory cell when a write operation is initiated;
providing the selected memory cell with a pre-selection voltage and a pre-selection current when the selected memory cell is positioned in a first group;
stopping the providing of the pre-selection voltage and the pre-selection current and providing the selected memory cell with a write voltage and a write current when a turning-on or a snapback is generated in the memory cell;
providing the selected memory cell with a pre-charge voltage and a pre-charge current when the selected memory cell is positioned in a second group; and
stopping the providing of the pre-charge voltage and the pre-charge current and providing the selected memory cell with the write voltage and the write current when the turning-on or the snapback is generated in the memory cell,
wherein the pre-selection voltage is different from the pre-charge voltage.

18. The method of claim 17, wherein the pre-selection voltage is a minimum voltage for turning-on the memory cell, and
wherein the first pre-charge voltage is higher than the pre-selection voltage and lower than the write voltage.

19. The method of claim 17, wherein the first group is adjacent to a control circuit block that is configured to drive the memory cell, and the second group is remote in relation to the control circuit block.

20. The method of claim 18, wherein the write voltage comprises a reset write voltage and a set write voltage that is lower than the reset write voltage, and the write current comprises a reset current and a set current that is lower than the reset current.

* * * * *